US009439311B2

(12) United States Patent
Hsu

(10) Patent No.: US 9,439,311 B2
(45) Date of Patent: Sep. 6, 2016

(54) PARALLELISM STABILIZATION STRUCTURE OF DUAL-SHAFT HINGE

(71) Applicant: FIRST DOME CORPORATION, New Taipei (TW)

(72) Inventor: An Szu Hsu, New Taipei (TW)

(73) Assignee: First Dome Corporation, New Taipei (TW)

( * ) Notice: Subject to any disclaimer, the term of this patent is extended or adjusted under 35 U.S.C. 154(b) by 162 days.

(21) Appl. No.: 14/261,732

(22) Filed: Apr. 25, 2014

(65) Prior Publication Data
US 2015/0245511 A1    Aug. 27, 2015

(30) Foreign Application Priority Data

Feb. 25, 2014  (TW) .............................. 103203194 U

(51) Int. Cl.
| E05D 3/06 | (2006.01) |
| E05D 3/12 | (2006.01) |
| H05K 5/02 | (2006.01) |
| G06F 1/16 | (2006.01) |
| H04M 1/02 | (2006.01) |
| F16H 57/021 | (2012.01) |

(52) U.S. Cl.
CPC ............. *H05K 5/0226* (2013.01); *E05D 3/122* (2013.01); *G06F 1/16* (2013.01); *H04M 1/02* (2013.01); *E05Y 2900/606* (2013.01); *F16H 57/021* (2013.01); *Y10T 74/1836* (2015.01)

(58) Field of Classification Search
CPC .......... E05D 3/12; E05D 3/122; E05D 3/06; E05D 3/10; E05D 11/087; G06F 1/1681; G06F 1/1616; G06F 1/1618; G06F 1/168; E05Y 2900/606; E05Y 2900/602; H04M 1/0216; H04M 1/0222; H04M 1/022; H05K 5/0226; Y10T 16/547; Y10T 16/5837; Y10T 15/53864; Y10T 16/541; Y10T 16/540255; Y10T 16/533; Y10T 16/5938; Y10T 16/54038

See application file for complete search history.

(56) References Cited

U.S. PATENT DOCUMENTS

| 7,140,074 | B2 * | 11/2006 | Han | G06F 1/1681 16/336 |
| 8,776,319 | B1 * | 7/2014 | Chang | G06F 1/1681 16/303 |
| 9,021,659 | B2 * | 5/2015 | Lin | E05D 11/06 16/303 |
| 9,057,215 | B1 * | 6/2015 | Horng | G06F 1/16 |
| 2002/0038493 | A1 * | 4/2002 | Ko | H04N 5/2251 16/303 |
| 2006/0238968 | A1 * | 10/2006 | Maatta | H04M 1/0218 361/679.01 |
| 2007/0226955 | A1 * | 10/2007 | Cho | E05D 3/122 16/354 |
| 2009/0070961 | A1 * | 3/2009 | Chung | E05D 3/122 16/354 |
| 2009/0083943 | A1 * | 4/2009 | Chen | G06F 1/1681 16/342 |

(Continued)

*Primary Examiner* — Chuck Mah
(74) *Attorney, Agent, or Firm* — Rosenberg, Klein & Lee

(57) ABSTRACT

A parallelism stabilization structure of dual-shaft hinge is installable on a pivotally openable/closable electronic apparatus. The parallelism stabilization structure includes a first rotary shaft and a second rotary shaft, which are parallel to each other and a link unit disposed between the two rotary shafts. A fixing unit is disposed between the two rotary shafts. The fixing unit includes two fixing members connected with each other. Two ends of each fixing member are respectively formed with a connection section and an enclosure section in which the first and second rotary shafts are pivotally disposed. The connection sections of the fixing members can be inserted and mated and connected with each other. The first and second rotary shafts can be easily assembled and located at lower cost. In operation, the deflection of the two rotary shafts is minimized to keep the parallelism of the two rotary shafts.

24 Claims, 4 Drawing Sheets

(56) References Cited

U.S. PATENT DOCUMENTS

| | | | | |
|---|---|---|---|---|
| 2009/0151116 A1* | 6/2009 | Lin | E05D 11/082 | 16/239 |
| 2010/0064475 A1* | 3/2010 | Wang | G06F 1/1616 | 16/232 |
| 2011/0289728 A1* | 12/2011 | Wang | E05D 3/122 | 16/337 |
| 2013/0152342 A1* | 6/2013 | Ahn | F16C 11/04 | 16/354 |
| 2013/0318746 A1* | 12/2013 | Kuramochi | G06F 1/1681 | 16/342 |
| 2013/0322004 A1* | 12/2013 | Park | F16C 11/10 | 361/679.27 |
| 2014/0223693 A1* | 8/2014 | Hsu | G06F 1/1681 | 16/282 |
| 2014/0338482 A1* | 11/2014 | Hsu | F16H 19/08 | 74/96 |
| 2014/0338483 A1* | 11/2014 | Hsu | F16H 21/44 | 74/96 |
| 2014/0360296 A1* | 12/2014 | Hsu | G06F 1/1616 | 74/98 |
| 2014/0373654 A1* | 12/2014 | Hsu | G06F 1/1618 | 74/96 |

* cited by examiner

PARALLELISM STABILIZATION STRUCTURE OF DUAL-SHAFT HINGE

BACKGROUND OF THE INVENTION

1. Field of the Invention

The present invention relates generally to a parallelism stabilization structure of dual-shaft hinge, and more particularly to a dual-shaft hinge mounted on a pivotally openable/closable electronic apparatus. The present invention also relates to a fixing unit, which helps in fixing the parallelism of two rotary shafts of the dual-shaft hinge.

2. Description of the Related Art

There are various pivotally openable/closable electronic apparatuses such as notebooks, mobile phones, PDA, digital image capturers and electronic books. The electronic apparatus has a display module (such as a screen) and an apparatus body module (such as a mainframe/keyboard). In general, one single rotary shaft is disposed between the display module and the apparatus body module, whereby the display module can be freely reciprocally rotated under external force. By means of the rotary shaft, the display module can be pivotally opened/closed to stretch or unstretch the electronic apparatus for operating or storing the electronic apparatus. In general, the pivotally opening angle of such single-shaft electronic apparatus is smaller than 180 degrees.

In order to operate the display module and the apparatus body module of the electronic apparatus in more operation modes and application ranges, a dual-shaft mechanism has been developed and arranged between the display module and the apparatus body module. The dual-shaft mechanism enables the display module and the apparatus body module to be relatively rotated by an angle within a range from zero degree to 360 degrees.

The dual-shaft mechanism is characterized in that two rotary shafts are disposed between the display module and the apparatus body module in parallel to each other. Each rotary shaft has a pivoted section at one end and a fixed section at the other end. The fixed sections of the rotary shafts are connected with the display module and the apparatus body module. The pivoted sections of the rotary shafts are together pivotally disposed on several bearing boards for supporting the rotary shafts and mounting the rotary shafts in a case. Accordingly, the display module and the apparatus body module can be respectively rotated by any angle around the bearing boards for operating the electronic apparatus in different modes.

However, the parallelism of the two rotary shafts is kept simply by means of the bearing boards. In general, the bearing board has the form of a plate so that the thickness of the periphery of the bearing board is generally quite limited. Therefore, the bearing boards can only respectively support the pivoted sections of the rotary shafts by the thickness of a plate. When operating the display module and/or the apparatus body module to force the two rotary shafts to rotate relative to each other, the fixed sections of the rotary shafts are driven by the rotational torque of the display module and the apparatus body module. Under such circumstance, the rotary shafts are likely to deflect to affect the parallelism of the two rotary shafts. After a long period of use, the rotary shafts are likely to swing, loosen or deflect. As a result, the electronic apparatus can be hardly stably operated.

In order to solve the above problem of unstable parallelism, it is necessary to increase the precision of the structures of the rotary shafts and the bearing boards and assemble these components at higher precision so as to lower the deflection of the rotary shafts. This will increase the difficulty in processing and increase the manufacturing cost.

SUMMARY OF THE INVENTION

It is therefore a primary object of the present invention to provide a parallelism stabilization structure of dual-shaft hinge. The parallelism stabilization structure is installable on a pivotally openable/closable electronic apparatus. The parallelism stabilization structure can be easily assembled and located at lower cost. Moreover, in operation of the two rotary shafts, the deflection of the rotary shafts is minimized to keep the parallelism of the two rotary shafts.

To achieve the above and other objects, the parallelism stabilization structure of dual-shaft hinge of the present invention includes a first rotary shaft and a second rotary shaft, which are parallel to each other, a link unit disposed between the first and second rotary shafts; and a fixing unit disposed between the first and second rotary shafts. The fixing unit includes a first fixing member and a second fixing member connected with each other. Two ends of the first fixing member are respectively formed with a first connection section and a first enclosure section in which the first rotary shaft is pivotally disposed. Two ends of the second fixing member are respectively formed with a second connection section and a second enclosure section in which the second rotary shaft is pivotally disposed. The first and second connection sections are mated and connected with each other and located between the first and second enclosure sections.

According to the above arrangement, the first and second rotary shafts are respectively pivotally restricted within the first and second enclosure sections of the fixing unit. The outer circumferences of the first and second rotary shafts respectively contact and attach to the inner circumferences of the first and second enclosure sections so as to enlarge the contact area between the first and second rotary shafts and the first and second enclosure sections. When a user pivotally opens or closes the display module or the apparatus body module of the electronic apparatus to force the first and second rotary shafts to relatively rotate, the first and second rotary shafts are restricted within the first and second enclosure sections so that the deflection of the first and second rotary shafts can be minimized to keep the parallelism of the first and second rotary shafts. Accordingly, the first and second rotary shafts are more durable and the lifetimes of the first and second rotary shafts are prolonged.

In addition, the first and second rotary shafts can be easily pivotally located in the first and second enclosure sections of the fixing unit. Also, the first and second fixing members can be easily assembled with each other to form the fixing unit as a fixing structure. Therefore, the assembling and processing processes are simplified and the manufacturing cost is lowered. In contrast, in the conventional dual-shaft structure, the components must be assembled at high precision for keeping the parallelism of the rotary shafts. This increases the difficulty in assembling and processing the components. As a result, the manufacturing cost is increased.

In the above parallelism stabilization structure of dual-shaft hinge, each of the first and second rotary shafts has a pivoted section at one end and a fixed section at the other end. The pivoted sections of the first and second rotary shafts are respectively pivotally disposed in the first and second enclosure sections. The link unit is disposed between the pivoted sections of the first and second rotary shafts. The link unit includes a first main gear disposed on the pivoted section of the first rotary shaft, a second main gear disposed on the pivoted section of the second rotary shaft, a first subsidiary gear engaged with the first main gear, a second subsidiary gear engaged with the second main gear, a first transmission gear coaxially arranged with the first subsidiary gear and a second transmission gear coaxially arranged with the second subsidiary gear. The first and second transmission gears are engaged with each other, whereby the first and second rotary shafts are drivingly connected with each other via the first and second transmission gears and the first and second subsidiary gears.

In the above parallelism stabilization structure of dual-shaft hinge, the pivoted section has a front end adjacent to the fixed section and a rear end distal from the fixed section. The front end of the pivoted section of the first rotary shaft is pivotally disposed in the first enclosure section, while the front end of the pivoted section of the second rotary shaft is pivotally disposed in the second enclosure section. The first main gear is disposed on the rear end of the pivoted section of the first rotary shaft, while the second main gear is disposed on the rear end of the pivoted section of the second rotary shaft. The first and second rotary shafts are sequentially pivotally disposed on a first bearing board, a second bearing board, a third bearing board and a fourth bearing board. The fixing unit is disposed between the first and second bearing boards. The first main gear and the first subsidiary gear are disposed between the second and third bearing boards. The first and second transmission gears are disposed between the third and fourth bearing boards. The fourth bearing board is disposed between the first and second transmission gears and the second main gear and the second subsidiary gear. The pivoted sections of the first and second rotary shafts are pivotally disposed on a fixing housing. The pivoted sections and the link unit and the fixing housing are together cooperatively mounted in a case. The front and rear ends of the pivoted sections of the first and second rotary shafts are respectively supported by the fixing unit and the fixing housing to more securely keep the parallelism of the first and second rotary shafts.

In the above parallelism stabilization structure of dual-shaft hinge, the fixing unit is a casing structure with two openings at two ends. The fixing unit has a substantially 8-shaped cross section. One end of the first fixing member is a bent plate structure forming the first connection section, while the other end of the first fixing member is a curled plate structure forming the first enclosure section. The first enclosure section defines a first tubular hole in which the first rotary shaft is pivotally disposed. One end of the second fixing member is a bent plate structure forming the second connection section, while the other end of the second fixing member is a curled plate structure forming the second enclosure section. The second enclosure section defines a second tubular hole in which the second rotary shaft is pivotally disposed. Accordingly, the first and second fixing members are made from metal plates by means of bending and curling the metal plates. The first and second connection sections are bound and assembled with each other to form the fixing unit. It is easy to bend and curl the metal plates so that the processing process is simplified and the manufacturing process is speeded to save cost.

In the above parallelism stabilization structure of dual-shaft hinge, the first connection section has a first middle plate and two first side plates, which are misaligned from the first middle plate. The first middle plate is positioned between the two first side plates and misaligned from the two first side plates. The second connection section also has a second middle plate and two first side plates, which are misaligned from the second middle plate. The second middle plate is positioned between the two second side plates and misaligned from the two second side plates. Accordingly, when the first connection section and the second connection section are inserted and assembled with each other, the first middle plate is right inserted between the two second side plates, while the second middle plate is right inserted between the two first side plates. The first middle plate is misaligned from the first side plates to an extent not more than the thickness of one plate and the second middle plate is misaligned from the second side plates to an extent not more than the thickness of one plate. Therefore, after the first and second connection sections are mated and connected with each other, the first middle plate is restricted between the second side plates, while the second middle plate is restricted between the first side plates, whereby the first middle plate, the first side plates, the second middle plate and the second side plates are bound with each other to enhance the stability of connection between the first and second fixing members.

In the above parallelism stabilization structure of dual-shaft hinge, the first and second rotary shafts both have a first rotational direction and a second rotational direction reverse to the first rotational direction. The first enclosure section and the second enclosure section both have a first directional curled board curled in the first rotational direction and a second directional curled board curled in the second rotational direction. Accordingly, the first directional curled board and second directional curled board of the first enclosure section respectively enclose the first rotary shaft in two directions. Therefore, when the first rotary shaft is rotated in the first rotational direction or the second rotational direction, the first directional curled board and second directional curled board of the first enclosure section can both provide a torque balance effect for the first rotary shaft. Similarly, the first directional curled board and second directional curled board of the second enclosure section respectively enclose the second rotary shaft in two directions. Therefore, when the second rotary shaft is rotated in the first rotational direction or the second rotational direction, the first directional curled board and second directional curled board of the second enclosure section can both provide a torque balance effect for the second rotary shaft.

In the above parallelism stabilization structure of dual-shaft hinge, the first directional curled board of the first enclosure section and the first directional curled board of the second enclosure section, and the second directional curled board of the first enclosure section and the second directional curled board of the second enclosure section are disposed on the first and second rotary shafts in two corresponding positions. Accordingly, the same radial section between the first and second rotary shafts is enclosed in the same rotational direction to further balance the torque between the first and second rotary shafts.

The present invention can be best understood through the following description and accompanying drawings, wherein:

DETAILED DESCRIPTION OF THE PREFERRED EMBODIMENTS

Figure 1:
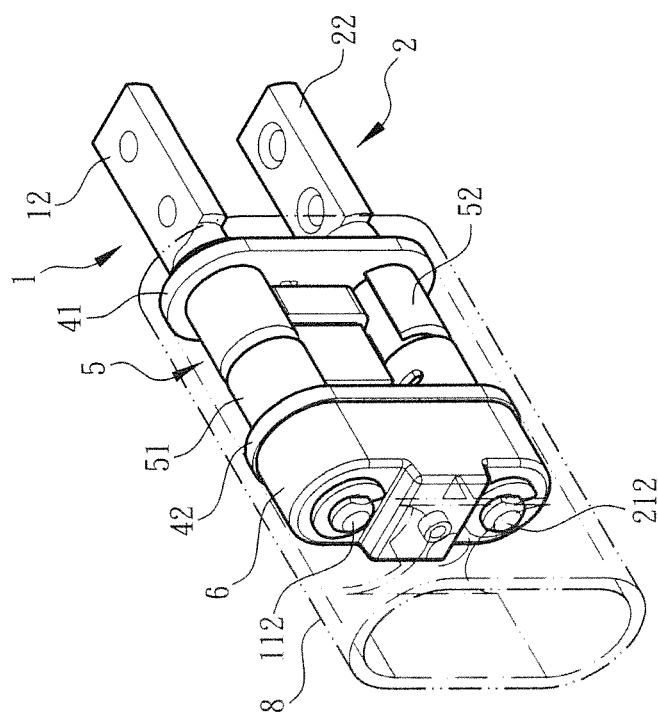
FIG. 1 is a perspective assembled view of a preferred embodiment of the present invention.
Figure 2:
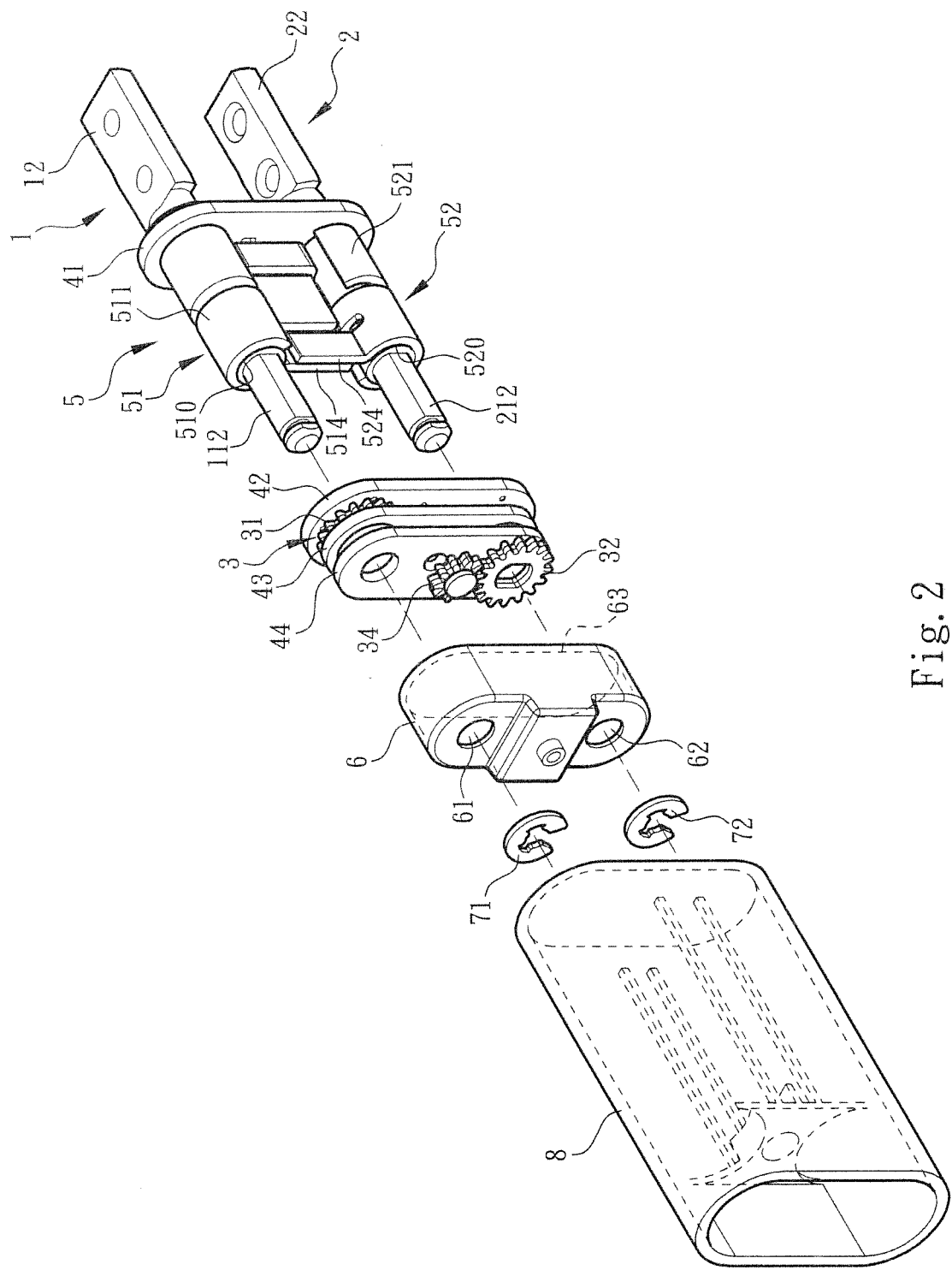
FIG. 2 is a perspective general exploded view of the preferred embodiment of the present invention.
Figure 3:
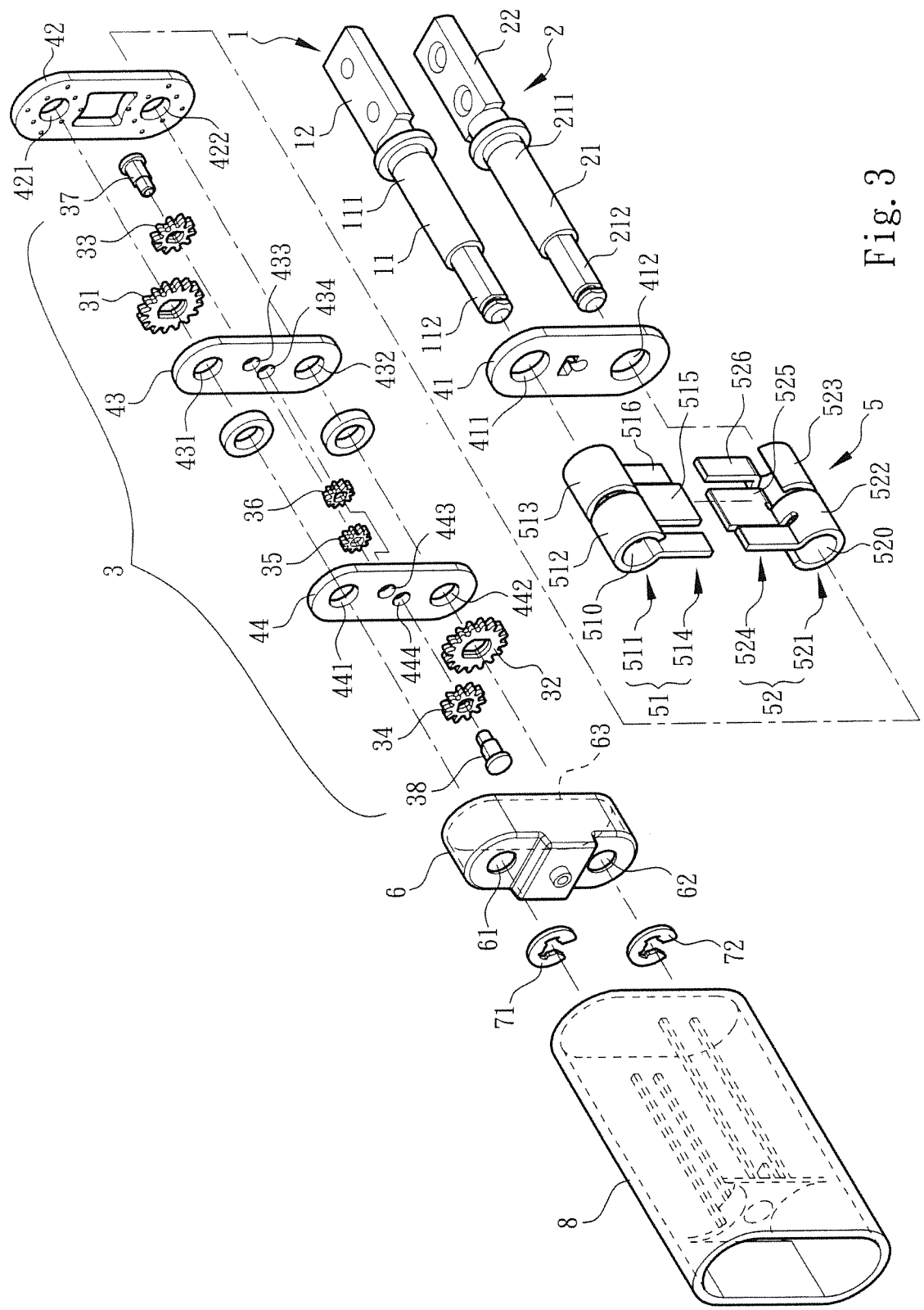
FIG. 3 is a perspective detailed exploded view of the preferred embodiment of the present invention.

Please refer to FIGS. 1 to 3. According to a preferred embodiment, the parallelism stabilization structure of dual-shaft hinge of the present invention is installable between the display module and the apparatus body module of a pivotally openable/closable electronic apparatus. The parallelism stabilization structure includes a first rotary shaft 1 and a second rotary shaft 2, which are parallel to each other. The parallelism stabilization structure further includes a link unit 3 disposed between the first and second rotary shafts 1, 2. The first and second rotary shafts 1, 2 are sequentially pivotally disposed on a first bearing board 41, a second bearing board 42, a third bearing board 43 and a fourth bearing board 44. Each of the first and second rotary shafts 1, 2 has a pivoted section 11, 21 at one end and a fixed section 12, 22 at the other end. The fixed section 12 of the first rotary shaft 1 is connected with and disposed on a display module of the electronic apparatus. The fixed section 22 of the second rotary shaft 2 is connected with and disposed on an apparatus body module of the electronic apparatus. The pivoted section 11 of the first rotary shaft 1 has a front end 111 adjacent to the fixed section 12 and a rear end 112 distal from the fixed section 12. The pivoted section 21 of the second rotary shaft 2 has a front end 211 adjacent to the fixed section 22 and a rear end 212 distal from the fixed section 22.

As shown in FIG. 3, the first bearing board 41, second bearing board 42, third bearing board 43 and fourth bearing board 44 are all in the form of a plate. Each of the first bearing board 41, second bearing board 42, third bearing board 43 and fourth bearing board 44 is formed with a first shaft hole 411, 421, 431, 441 and a second shaft hole 412, 422, 432, 442. The pivoted section 11 of the first rotary shaft 1 is pivotally disposed in the first shaft holes 411, 421, 431, 441 of the first bearing board 41, second bearing board 42, third bearing board 43 and fourth bearing board 44. The pivoted section 21 of the second rotary shaft 2 is pivotally disposed in the second shaft holes 412, 422, 432, 442 of the first bearing board 41, second bearing board 42, third bearing board 43 and fourth bearing board 44. Accordingly, the first and second rotary shafts 1, 2 can be relatively rotated in parallel to each other. The pivoted sections 11, 21 of the first and second rotary shafts 1, 2 are supported and located in a case 8 by means of the first bearing board 41, second bearing board 42, third bearing board 43 and fourth bearing board 44. The first bearing board 41 is positioned on the pivoted sections 11, 21 of the first and second rotary shafts 1, 2 in adjacency to the fixed sections 12, 22. The fixed sections 12, 22 of the first and second rotary shafts 1, 2 outward protrude from the case 8.

As shown in FIGS. 2 and 3, the link unit 3 is disposed between the pivoted sections 11, 21 of the first and second rotary shafts 1, 2. The link unit 3 includes a first main gear 31 disposed at the rear end 112 of the pivoted section 11 of the first rotary shaft 1, a second main gear 32 disposed at the rear end 212 of the pivoted section 21 of the second rotary shaft 2, a first subsidiary gear 33 engaged with the first main gear 31, a second subsidiary gear 34 engaged with the second main gear 32, a first transmission gear 35 coaxially arranged with the first subsidiary gear 33 and a second transmission gear 36 coaxially arranged with the second subsidiary gear 34. The first and second transmission gears 35, 36 are engaged with each other. Accordingly, the first and second rotary shafts 1, 2 are drivingly connected with each other via the first and second transmission gears 35, 36 and the first and second subsidiary gears 33, 34.

To speak more specifically, the first main gear 31 and the first subsidiary gear 33 are disposed between the second and third bearing boards 42, 43. The first and second transmission gears 35, 36 are disposed between the third and fourth bearing boards 43, 44. The fourth bearing board 44 is disposed between the first and second transmission gears 35, 36 and the second main gear 32 and the second subsidiary gear 34. Each of the third and fourth bearing boards 43, 44 is formed with a first pivot hole 433, 443 and a second pivot hole 434, 444. The first pivot holes 433, 443 and the second pivot hole 434, 444s are positioned between the first shaft holes 431, 441 and the second shaft holes 432, 442 of the third and fourth bearing boards 43, 44. A first pivot pin 37 is pivotally disposed in the first pivot holes 433, 443 and a second pivot pin 38 is pivotally disposed in the second pivot holes 434, 444. The first subsidiary gear 33 and the first transmission gear 35 are pivotally mounted on the first pivot pin 37 and positioned on two sides of the third bearing board 43. The second subsidiary gear 34 and the second transmission gear 36 are pivotally mounted on the second pivot pin 38 and positioned on two sides of the fourth bearing board 44.

As shown in the drawings, in this embodiment, a fixing unit 5 is disposed between the first and second rotary shafts 1, 2 and positioned between the first and second bearing boards 41, 42. The fixing unit 5 is a casing structure with two openings at two ends. The fixing unit 5 has a substantially 8-shaped cross section. The fixing unit 5 includes a first fixing member 51 and a second fixing member 52 connected with each other. Two ends of the first fixing member 51 are respectively formed with a first connection section 514 and a first enclosure section 511. The first enclosure section 511 defines the openings at two ends of the fixing unit 5. The front end 111 of the pivoted section 11 of the first rotary shaft 1 is pivotally disposed in the first enclosure section 511. Two ends of the second fixing member 52 are respectively formed with a second connection section 524 and a second enclosure section 521. The second enclosure section 521 defines the openings at two ends of the fixing unit 5. The front end 211 of the pivoted section 21 of the second rotary shaft 2 is pivotally disposed in the second enclosure section 521.

The first connection section 514 has a first middle plate 515 and two first side plates 516, which are misaligned from the first middle plate 515. The first middle plate 515 is positioned between the two first side plates 516 and misaligned from the two first side plates 516, whereby the first middle plate 515 and the first side plates 516 are forward and backward arranged at three points. The second connection section 524 also has a second middle plate 525 and two second side plates 526, which are misaligned from the second middle plate 525. The second middle plate 525 is positioned between the two second side plates 526 and misaligned from the two second side plates 526, whereby the second middle plate 525 and the second side plates 526 are forward and backward arranged at three points. When the first connection section 514 and the second connection section 524 are inserted and assembled with each other, the first middle plate 515 is right inserted between the two second side plates 526, while the second middle plate 525 is right inserted between the two first side plates 516. Accordingly, the first middle plate 515, the first side plates 516, the second middle plate 525 and the second side plates 526 are interlaced and overlapped with each other so that the first and second connection sections 514, 524 are mated with each other and located between the first and second enclosure sections 511, 521. The first middle plate 515 is misaligned from the first side plates 516 to an extent over the thickness of one plate. Also, the second middle plate 525 is misaligned from the second side plates 526 to an extent not more than the thickness of one plate.

Figure 4:
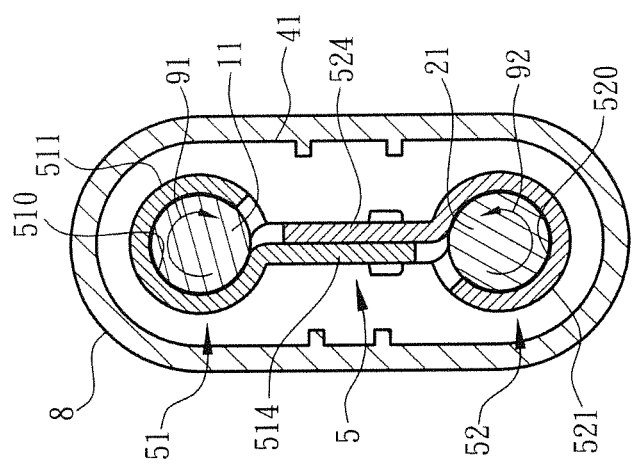
FIG. 4 is a sectional assembled view of the preferred embodiment of the present invention.

Please refer to FIG. 4. In practice, one end of the first fixing member 51 of the fixing unit 5 is a bent plate structure forming the first connection section 514, while the other end of the first fixing member 51 is a curled plate structure forming the first enclosure section 511. The first enclosure section 511 defines a first tubular hole 510 in which the front end 111 of the pivoted section 11 of the first rotary shaft 1 is pivotally disposed. One end of the second fixing member 52 of the fixing unit 5 is a bent plate structure forming the second connection section 524, while the other end of the second fixing member 52 is a curled plate structure forming the second enclosure section 521. The second enclosure section 521 defines a second tubular hole 520 in which the front end 211 of the pivoted section 21 of the second rotary shaft 2 is pivotally disposed. The first and second rotary shafts 1 and 2 both have a first rotational direction 91 and a second rotational direction 92 reverse to the first rotational direction 91. The first enclosure section 511 has a first directional curled board 512 curled in the first rotational direction 91 and a second directional curled board 513 curled in the second rotational direction 92. The second enclosure section 521 has a first directional curled board 522 curled in the first rotational direction 91 and a second directional curled board 523 curled in the second rotational direction 92. The first directional curled board 512 of the first enclosure section 511 and the first directional curled board 522 of the second enclosure section 521, and the second directional curled board 513 of the first enclosure section 511 and the second directional curled board 523 of the second enclosure section 521 are disposed on the first and second rotary shafts 1,2 in two corresponding positions.

According to the above arrangement, after the first and second connection sections 514, 524 are mated and connected with each other, the first middle plate 515 is restricted between the second side plates 526, while the second middle plate 525 is restricted between the first side plates 516, whereby the first middle plate 515, the first side plates 516, the second middle plate 525 and the second side plates 526 are bound with each other to enhance the stability of connection between the first and second fixing members 51, 52. In use, the front ends 111, 211 of the pivoted sections 11, 21 of the first and second rotary shafts 1, 2 are respectively pivotally restricted within the first and second tubular holes 510, 520 of the first and second enclosure sections 511, 521 of the fixing unit 5. The outer circumferences of the front ends 111, 211 of the pivoted sections 11, 21 of the first and second rotary shafts 1, 2 respectively contact and attach to the inner circumferences of the first and second tubular holes 510, 520 of the first and second enclosure sections 511, 521 so as to enlarge the contact area between the front ends 111, 211 of the pivoted sections 11, 21 of the first and second rotary shafts 1, 2 and the first and second enclosure sections 511, 521. When a user pivotally opens or closes the display module or the apparatus body module of the electronic apparatus to force the first and second rotary shafts 1, 2 to relatively rotate, the front ends 111, 211 of the pivoted sections 11, 21 of the first and second rotary shafts 1, 2 are restricted within the first and second enclosure sections 511, 521 so that the deflection of the first and second rotary shafts 1, 2 can be minimized.

During the relative rotation of the first and second rotary shafts, 1, 2, the first directional curled board 512 and second directional curled board 513 of the first enclosure section 511 respectively enclose the pivoted section 11 of the first rotary shaft 1 in two directions. Therefore, when the first rotary shaft 1 is rotated in the first rotational direction 91 or the second rotational direction 92, the first directional curled board 512 and second directional curled board 513 of the first enclosure section 511 can both provide a torque balance effect for the first rotary shaft 1. Similarly, the first directional curled board 522 and second directional curled board 523 of the second enclosure section 521 respectively enclose the pivoted section 21 of the second rotary shaft 2 in two directions. Therefore, when the second rotary shaft 2 is rotated in the first rotational direction 91 or the second rotational direction 92, the first directional curled board 522 and second directional curled board 523 of the second enclosure section 521 can both provide a torque balance effect for the second rotary shaft 2. Also, when the first rotary shaft 1 is rotated in the first rotational direction 91, the first enclosure section 511, the first middle plate 515 and the first side plates 516 of the first fixing member 51 are driven to rotate in the first rotational direction 91. Accordingly, the first middle plate 515 of the first fixing member 51 pushes the second middle plate 525 of the second fixing member 52 to make the second enclosure section 521 of the second fixing member 52 rotate in the second rotational direction 92. When the first rotary shaft 1 is rotated in the second rotational direction 92, the first enclosure section 511, the first middle plate 515 and the first side plates 516 of the first fixing member 51 are driven to rotate in the second rotational direction 92. Accordingly, the first side plates 516 of the first fixing member 51 push the second side plates 526 of the second fixing member 52 to make the second enclosure section 521 of the second fixing member 52 rotate in the first rotational direction 91. The same radial section between the first and second rotary shafts 1, 2 is enclosed in the same rotational direction to further balance the torque between the first and second rotary shafts 1, 2. This can overcome the problem of deflection of the first and second rotary shafts 1, 2 to keep the parallelism of the first and second rotary shafts 1, 2. Accordingly, the first and second rotary shafts 1, 2 are more durable and the lifetimes of the first and second rotary shafts 1, 2 are prolonged.

In addition, the first and second rotary shafts 1, 2 can be easily pivotally located in the first and second enclosure sections 511, 521 of the fixing unit 5. Also, by means of the first and second connection sections 514, 524, the first and second fixing members 51, 52 can be easily assembled with each other to form the fixing unit 5 as a fixing structure. Therefore, the assembling and processing processes are simplified and the manufacturing cost is lowered. In contrast, in the conventional dual-shaft structure, the components must be assembled at high precision for keeping the parallelism of the rotary shafts. This increases the difficulty in assembling and processing the components. As a result, the manufacturing cost is increased.

Furthermore, the first and second fixing members 51, 52 of the fixing unit 5 are made from metal plates by means of bending and curling the metal plates. The first and second connection sections 514, 524 are bound and assembled with each other to form the fixing unit 5. It is easy to bend and curl the metal plates so that the processing process is simplified and the manufacturing process is speeded to save cost.

Referring to FIGS. 1, 2 and 3, in a preferred embodiment, the present invention further includes a fixing housing 6 formed with a first shaft hole 61 and a second shaft hole 62. The rear end 112 of the pivoted section 11 of the first rotary shaft 1 is passed through the first shaft hole 61 of the fixing housing 6 and latched with a C-shaped retainer ring 71. The rear end 212 of the pivoted section 21 of the second rotary shaft 2 is passed through the second shaft hole 62 of the fixing housing 6 and latched with a C-shaped retainer ring 72. Accordingly, the rear ends 112, 212 of the pivoted sections 11, 21 of the first and second rotary shafts 1, 2 are together pivotally disposed on the fixing housing 6. The pivoted sections 11, 21 of the first and second rotary shafts 1, 2 and the link unit 3 and the fixing housing 6 are together cooperatively mounted in the case 8. It should be noted that the fixing housing 6 serves as a rotational support point for the rear ends 112, 212 of the pivoted sections 11, 21 of the first and second rotary shafts 1, 2 and the front ends 111, 211 of the pivoted sections 11, 21 are assembled with the fixing unit 5 as a fixing mechanism. Accordingly, every section of the pivoted sections 11, 21 of the first and second rotary shafts 1, 2 is fixed or supported. Therefore, when a user operates the display module or the apparatus body module to drive and rotate the fixed sections 12, 22 of the first and second rotary shafts 1, 2, the parallelism of the first and second rotary shafts 1, 2 can be kept stable.

It should be noted that FIGS. 2 and 3 show that the fixing housing 6 has a receiving cavity 63 directed to the fixing unit 5. The first main gear 31, the second main gear 32, the first subsidiary gear 33, the second subsidiary gear 34, the first transmission gear 35 and the second transmission gear 36 are received in the receiving cavity 63. Accordingly, the first main gear 31, the second main gear 32, the first subsidiary gear 33, the second subsidiary gear 34, the first transmission gear 35 and the second transmission gear 36 can be designed as a one-piece module disposed in the receiving cavity 63 of the fixing housing 6 to simplify the structure and facilitate the assembling process. Also, the fixing housing 6 provides a protection and locating effect for the link unit 3 so that the transmission effect between the first and second rotary shafts 1, 2 is more stable.

The above embodiments are only used to illustrate the present invention, not intended to limit the scope thereof. Many modifications of the above embodiments can be made without departing from the spirit of the present invention.

What is claimed is:

1. A parallelism stabilization structure of dual-shaft hinge, comprising:
   a first rotary shaft and a second rotary shaft, which are parallel to each other;
   a link unit connecting the first and second rotary shafts forming a first coupling between the first and second rotary shafts; and
   a fixing unit connecting the first and second rotary shafts forming a second coupling between the first and second rotary shafts, the fixing unit including a first fixing member and a second fixing member connected with each other, two ends of the first fixing member being respectively formed with a first fixing connection section and a first enclosure section in which the first rotary shaft is pivotally disposed, two ends of the second fixing member being respectively formed with a second fixing connection section and a second enclosure section in which the second rotary shaft is pivotally disposed, the first and second fixing connection sections being mated and fixed with each other and located between the first and second enclosure sections;
   wherein each of the first and second rotary shafts has a pivoted section at one end and a fixed section at the other end, the pivoted sections of the first and second rotary shafts being respectively pivotally disposed in the first and second enclosure sections; and
   wherein the link unit is disposed between the pivoted sections of the first and second rotary shafts, the link unit including a first main gear disposed on the pivoted section of the first rotary shaft, a second main gear disposed on the pivoted section of the second rotary shaft, a first subsidiary gear engaged with the first main gear, a second subsidiary gear engaged with the second main gear, a first transmission gear coaxially arranged with the first subsidiary gear and a second transmission gear coaxially arranged with the second subsidiary gear, the first and second transmission gears being engaged with each other, whereby the first and second rotary shafts are drivingly connected with each other.

2. The parallelism stabilization structure of dual-shaft hinge as claimed in claim 1, wherein the pivoted section has a front end adjacent to the fixed section and a rear end distal from the fixed section, the front end of the pivoted section of the first rotary shaft being pivotally disposed in the first enclosure section, while the front end of the pivoted section of the second rotary shaft being pivotally disposed in the second enclosure section, the first main gear being disposed on the rear end of the pivoted section of the first rotary shaft, while the second main gear being disposed on the rear end of the pivoted section of the second rotary shaft.

3. The parallelism stabilization structure of dual-shaft hinge as claimed in claim 2, wherein the first and second rotary shafts are sequentially pivotally disposed on a first bearing board, a second bearing board, a third bearing board and a fourth bearing board, the fixing unit being disposed between the first and second bearing boards, the first main gear and the first subsidiary gear being disposed between the second and third bearing boards, the first and second transmission gears being disposed between the third and fourth bearing boards, the fourth bearing board being disposed between the first and second transmission gears and the second main gear and the second subsidiary gear.

4. The parallelism stabilization structure of dual-shaft hinge as claimed in claim 1, wherein the pivoted sections of the first and second rotary shafts are pivotally disposed on a fixing housing, and the pivoted sections of the first and second rotary shafts and the link unit and the fixing housing being together cooperatively mounted in a case.

5. The parallelism stabilization structure of dual-shaft hinge as claimed in claim 1, wherein one end of the first fixing member is a bent plate structure forming the first fixing connection section, while the other end of the first fixing member is a curled plate structure forming the first enclosure section, the first enclosure section defining a first tubular hole in which the first rotary shaft is pivotally disposed, one end of the second fixing member being a bent plate structure forming the second fixing connection section, while the other end of the second fixing member being a curled plate structure forming the second enclosure section, the second enclosure section defining a second tubular hole in which the second rotary shaft is pivotally disposed.

6. The parallelism stabilization structure of dual-shaft hinge as claimed in claim 5, wherein the first fixing connection section has a first middle plate and two first side plates, which are misaligned from the first middle plate, the first middle plate being positioned between the two first side plates and misaligned from the two first side plates, the second fixing connection section also having a second middle plate and two first side plates, which are misaligned from the second middle plate, the second middle plate being positioned between the two second side plates and misaligned from the two second side plates, whereby when the first fixing connection section and the second fixing connection section are inserted and assembled with each other, the first middle plate is right inserted between the two second side plates, while the second middle plate is right inserted between the two first side plates.

7. The parallelism stabilization structure of dual-shaft hinge as claimed in claim 6, wherein the first middle plate is misaligned from the first side plates to an extent not more than the thickness of any of said plates and the second middle plate is misaligned from the second side plates to an extent not more than the thickness of any of said plates.

8. The parallelism stabilization structure of dual-shaft hinge as claimed in claim 5, wherein the first and second rotary shafts both have a first rotational direction and a second rotational direction reverse to the first rotational direction, the first enclosure section and the second enclosure section both having a first directional curled board curled in the first rotational direction and a second directional curled board curled in the second rotational direction.

9. The parallelism stabilization structure of dual-shaft hinge as claimed in claim 8, wherein the first directional curled board of the first enclosure section and the first directional curled board of the second enclosure section, and the second directional curled board of the first enclosure section and the second directional curled board of the second enclosure section are disposed on the first and second rotary shafts in two corresponding positions.

10. The parallelism stabilization structure of dual-shaft hinge as claimed in claim 1, wherein the first fixing connection section has a first middle plate and two first side plates, which are misaligned from the first middle plate, the first middle plate being positioned between the two first side plates and misaligned from the two first side plates, the second fixing connection section also having a second middle plate and two first side plates, which are misaligned from the second middle plate, the second middle plate being positioned between the two second side plates and misaligned from the two second side plates, whereby when the first fixing connection section and the second fixing connection section are inserted and assembled with each other, the first middle plate is right inserted between the two second side plates, while the second middle plate is right inserted between the two first side plates.

11. The parallelism stabilization structure of dual-shaft hinge as claimed in claim 10, wherein the first middle plate is misaligned from the first side plates to an extent not more than the thickness of any of said plates and the second middle plate is misaligned from the second side plates to an extent not more than the thickness of any of said plates.

12. The parallelism stabilization structure of dual-shaft hinge as claimed in claim 1, wherein the first and second rotary shafts both have a first rotational direction and a second rotational direction reverse to the first rotational direction, the first enclosure section and the second enclosure section both having a first directional curled board curled in the first rotational direction and a second directional curled board curled in the second rotational direction.

13. The parallelism stabilization structure of dual-shaft hinge as claimed in claim 12, wherein the first directional curled board of the first enclosure section and the first directional curled board of the second enclosure section, and the second directional curled board of the first enclosure section and the second directional curled board of the second enclosure section are disposed on the first and second rotary shafts in two corresponding positions.

14. A parallelism stabilization structure of dual-shaft hinge, comprising:
  a first rotary shaft and a second rotary shaft, which are parallel to each other;
  a link unit connecting the first and second rotary shafts forming a first coupling between the first and second rotary shafts; and
  a fixing unit connecting the first and second rotary shafts forming a second coupling between the first and second rotary shafts, the fixing unit including a first fixing member and a second fixing member connected with each other, two ends of the first fixing member being respectively formed with a first fixing connection section and a first enclosure section in which the first rotary shaft is pivotally disposed, two ends of the second fixing member being respectively formed with a second fixing connection section and a second enclosure section in which the second rotary shaft is pivotally disposed, the first and second fixing connection sections being mated and fixed with each other and located between the first and second enclosure sections;
  wherein each of the first and second rotary shafts has a pivoted section at one end and a fixed section at the other end, the pivoted sections of the first and second rotary shafts being respectively pivotally disposed in the first and second enclosure sections; and
  wherein the pivoted sections of the first and second rotary shafts are pivotally disposed on a fixing housing, and the pivoted sections of the first and second rotary shafts and the link unit and the fixing housing being together cooperatively mounted in a case.

15. The parallelism stabilization structure of dual-shaft hinge as claimed in claim 14, wherein one end of the first fixing member is a bent plate structure forming the first fixing connection section, while the other end of the first fixing member is a curled plate structure forming the first enclosure section, the first enclosure section defining a first tubular hole in which the first rotary shaft is pivotally disposed, one end of the second fixing member being a bent plate structure forming the second fixing connection section, while the other end of the second fixing member being a curled plate structure forming the second enclosure section, the second enclosure section defining a second tubular hole in which the second rotary shaft is pivotally disposed.

16. The parallelism stabilization structure of dual-shaft hinge as claimed in claim 15, wherein the first fixing connection section has a first middle plate and two first side plates, which are misaligned from the first middle plate, the first middle plate being positioned between the two first side plates and misaligned from the two first side plates, the second fixing connection section also having a second middle plate and two first side plates, which are misaligned from the second middle plate, the second middle plate being positioned between the two second side plates and misaligned from the two second side plates, whereby when the first fixing connection section and the second fixing connection section are inserted and assembled with each other, the first middle plate is right inserted between the two second side plates, while the second middle plate is right inserted between the two first side plates.

17. The parallelism stabilization structure of dual-shaft hinge as claimed in claim 14, wherein the first fixing connection section has a first middle plate and two first side plates, which are misaligned from the first middle plate, the first middle plate being positioned between the two first side plates and misaligned from the two first side plates, the second fixing connection section also having a second middle plate and two first side plates, which are misaligned from the second middle plate, the second middle plate being positioned between the two second side plates and misaligned from the two second side plates, whereby when the first fixing connection section and the second fixing connection section are inserted and assembled with each other, the first middle plate is right inserted between the two second side plates, while the second middle plate is right inserted between the two first side plates.

18. The parallelism stabilization structure of dual-shaft hinge as claimed in claim 17, wherein the first middle plate is misaligned from the first side plates to an extent not more than the thickness of any of said plates and the second middle plate is misaligned from the second side plates to an extent not more than the thickness of any of said plates.

19. A parallelism stabilization structure of dual-shaft hinge, comprising:
    a first rotary shaft and a second rotary shaft, which are parallel to each other;
    a link unit connecting the first and second rotary shafts forming a first coupling between the first and second rotary shafts; and
    a fixing unit connecting the first and second rotary shafts forming a second coupling between the first and second rotary shafts, the fixing unit including a first fixing member and a second fixing member connected with each other, two ends of the first fixing member being respectively formed with a first fixing connection section and a first enclosure section in which the first rotary shaft is pivotally disposed, two ends of the second fixing member being respectively formed with a second fixing connection section and a second enclosure section in which the second rotary shaft is pivotally disposed, the first and second fixing connection sections being mated and fixed with each other and located between the first and second enclosure sections;
    wherein the first fixing connection section has a first middle plate and two first side plates, which are misaligned from the first middle plate, the first middle plate being positioned between the two first side plates and misaligned from the two first side plates, the second fixing connection section also having a second middle plate and two first side plates, which are misaligned from the second middle plate, the second middle plate being positioned between the two second side plates and misaligned from the two second side plates, whereby when the first fixing connection section and the second fixing connection section are inserted and assembled with each other, the first middle plate is right inserted between the two second side plates, while the second middle plate is right inserted between the two first side plates.

20. The parallelism stabilization structure of dual-shaft hinge as claimed in claim 19, wherein the first middle plate is misaligned from the first side plates to an extent not more than the thickness of any of said plates and the second middle plate is misaligned from the second side plates to an extent not more than the thickness of any of said plates.

21. The parallelism stabilization structure of dual-shaft hinge as claimed in claim 14, wherein the first and second rotary shafts both have a first rotational direction and a second rotational direction reverse to the first rotational direction, the first enclosure section and the second enclosure section both having a first directional curled board curled in the first rotational direction and a second directional curled board curled in the second rotational direction.

22. The parallelism stabilization structure of dual-shaft hinge as claimed in claim 21, wherein the first directional curled board of the first enclosure section and the first directional curled board of the second enclosure section, and the second directional curled board of the first enclosure section and the second directional curled board of the second enclosure section are disposed on the first and second rotary shafts in two corresponding positions.

23. The parallelism stabilization structure of dual-shaft hinge as claimed in claim 19, wherein the first and second rotary shafts both have a first rotational direction and a second rotational direction reverse to the first rotational direction, the first enclosure section and the second enclosure section both having a first directional curled board curled in the first rotational direction and a second directional curled board curled in the second rotational direction.

24. The parallelism stabilization structure of dual-shaft hinge as claimed in claim 23, wherein the first directional curled board of the first enclosure section and the first directional curled board of the second enclosure section, and the second directional curled board of the first enclosure section and the second directional curled board of the second enclosure section are disposed on the first and second rotary shafts in two corresponding positions.

* * * * *